(12) United States Patent
Abe (10) Patent No.: US 11,304,291 B2
(45) Date of Patent: Apr. 12, 2022

(54) CIRCUIT BOARD AND LIGHT EMITTING DEVICE INCLUDING CIRCUIT BOARD

(71) Applicant: KYOCERA Corporation, Kyoto (JP)

(72) Inventor: Yuichi Abe, Satsumasendai (JP)

(73) Assignee: KYOCERA CORPORATION, Kyoto (JP)

( * ) Notice: Subject to any disclaimer, the term of this patent is extended or adjusted under 35 U.S.C. 154(b) by 137 days.

(21) Appl. No.: 16/620,349

(22) PCT Filed: May 30, 2018

(86) PCT No.: PCT/JP2018/020759
§ 371 (c)(1),
(2) Date: Dec. 6, 2019

(87) PCT Pub. No.: WO2019/003775
PCT Pub. Date: Jan. 3, 2019

(65) Prior Publication Data
US 2020/0214123 A1    Jul. 2, 2020

(30) Foreign Application Priority Data

Jun. 29, 2017 (JP) .............................. JP2017-127610

(51) Int. Cl.
*H01L 33/56* (2010.01)
*H05K 1/02* (2006.01)
(Continued)

(52) U.S. Cl.
CPC ........... *H05K 1/0274* (2013.01); *H01L 33/60* (2013.01); *H01L 33/62* (2013.01); *H05K 1/18* (2013.01); *H05K 3/26* (2013.01); *H01L 2933/0058* (2013.01); *H05K 2201/0162* (2013.01); *H05K 2201/0209* (2013.01); *H05K 2201/0215* (2013.01)

(58) Field of Classification Search
None
See application file for complete search history.

(56) References Cited

U.S. PATENT DOCUMENTS

2008/0239216 A1    10/2008   Miyamoto et al.
2012/0181560 A1     7/2012   Hiramatsu et al.
(Continued)

FOREIGN PATENT DOCUMENTS

JP    2009-129801 A    6/2009
JP    2012-151191 A    8/2012
(Continued)

OTHER PUBLICATIONS

Yasuhiro et al., WO 2017/135237A1, published Aug. 10, 2017.*

*Primary Examiner* — Suberr L Chi
(74) *Attorney, Agent, or Firm* — Volpe Koenig (57) ABSTRACT

A circuit board according to the present disclosure includes a substrate, a conductor layer arranged on the substrate, a reflective layer arranged on the conductor layer, and a silicone-resin layer arranged on the substrate. The silicone-resin layer is in contact with the conductor layer and the reflective layer. The silicone-resin layer contains equal to or more than 45% by mass of a plurality of fillers. A first filler whose aspect ratio is larger than 5 occupies equal to or more than 5% of 100% of a total number of the fillers.

13 Claims, 1 Drawing Sheet (51) Int. Cl.
*H01L 33/60* (2010.01)
*H01L 33/62* (2010.01)
*H05K 1/18* (2006.01)
*H05K 3/26* (2006.01)

(56) References Cited

U.S. PATENT DOCUMENTS

2014/0191263 A1* 7/2014 Wang .................. C08L 67/02
257/98
2016/0284959 A1 9/2016 Ishikawa
2017/0053903 A1 2/2017 Nishimura et al.

FOREIGN PATENT DOCUMENTS

| | | |
|---|---|---|
| JP | 2015-162623 A | 9/2015 |
| JP | 2016-018068 A | 2/2016 |
| JP | 2016-184708 A | 10/2016 |
| WO | 2007/114306 A1 | 10/2007 |
| WO | 2014/042201 A1 | 3/2014 |

* cited by examiner

CIRCUIT BOARD AND LIGHT EMITTING DEVICE INCLUDING CIRCUIT BOARD

FIELD

The present disclosure relates to a circuit board and a light emitting device including the circuit board.

BACKGROUND

A light emitting diode (LED) has drawn attention as a light emitting element whose power consumption is little. In mounting such a light emitting element, a circuit board including a non-conductive substrate and a conductive layer to be a circuit (wiring) positioned on the substrate is used.

Improvement in luminous efficiency is demanded for a light emitting device that is obtained by mounting a light emitting element on the circuit board having the above-mentioned configuration, and thus a surface of the substrate is covered by a resin whose color tone is a white-color tone in order to improve the luminous efficiency (see Patent Literature 1, for example).

CITATION LIST

Patent Literature

Patent Literature 1: Japanese Patent Application Laid-open No. 2009-129801

SUMMARY

Solution to Problem

A circuit board according to the present disclosure includes: a substrate; a conductor layer arranged on the substrate; a reflective layer arranged on the conductor layer; and a silicone-resin layer arranged on the substrate. The silicone-resin layer is in contact with the conductor layer and the reflective layer. The silicone-resin layer contains equal to or more than 45% by mass of a plurality of fillers, and a first filler whose aspect ratio is larger than 5 occupies equal to or more than 5% of 100% of a total number of the fillers.

A light emitting device according to the present disclosure includes: the above-mentioned circuit board; and a light emitting element arranged on the circuit board.

DESCRIPTION OF EMBODIMENTS

Recently, a reflective layer is arranged on a conductive layer in order to improve luminous efficiency. On a surface of a substrate, a portion thereof other than portions on which the conductive layer and the reflective layer arranged is covered by a resin whose color tone is a white-color tone to improve its luminous efficiency.

When employing a configuration that includes both of a resin and a reflective layer, a configuration is generally employed in which a portion on a substrate of a circuit board is filled with the resin, on which a conductive layer and the reflective layer arranged on the conductive layer are not present. However, in order to manufacture such a circuit board, execution of a process for polishing the resin and the reflective layer is needed so as to adjust heights of the resin and the reflective layer. In this case, when the hardness of the resin is low, the resin is damaged in the polishing treatment, and thus there presents possibility that desired reflectance is not obtained.

Hereinafter, a circuit board and a light emitting device according to the present disclosure will be explained with reference to FIG. 1.

Figure 1:
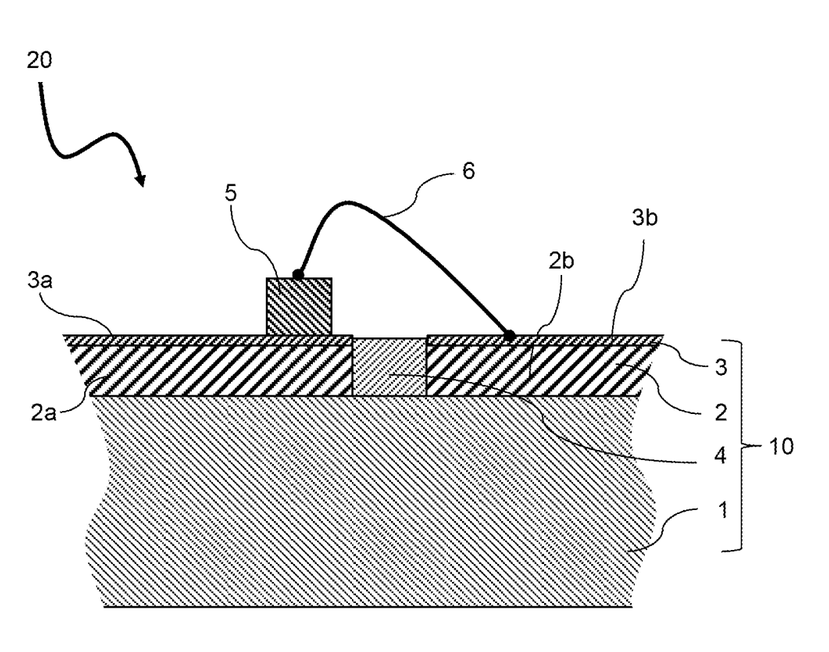
FIG. 1 is a cross sectional view schematically illustrating one example of the periphery of a light emitting element of a light emitting device according to the present disclosure.

As illustrated in FIG. 1, a circuit board 10 according to the present disclosure includes a substrate 1, a conductor layer 2 arranged on the substrate 1, a reflective layer 3 arranged on the conductor layer 2, and a silicone-resin layer 4 that is arranged on the substrate 1 and is in contact with the conductor layer 2 and the reflective layer 3.

The silicone-resin layer 4 of the circuit board 10 according to the present disclosure contains equal to or more than 45% by mass of a plurality of fillers. A first filler whose aspect ratio is equal to or larger than 5 occupies equal to or more than 5% of 100% by number of all of the fillers.

A silicone resin has a resistance to an ultraviolet ray which is stronger than a resistance of another resin (for example, epoxy resin) whose color tone is a white-color tone so as to maintain a high reflectance for a long time interval. The silicone-resin layer 4 has a high hardness, which includes a silicone resin in which the first fillers having a high aspect ratio are entangled with each other. The silicone-resin layer 4 has a high hardness, and thus damage to the silicone-resin layer 4 is reduced even when a polishing treatment is performed on the silicone-resin layer 4 and the reflective layer 3 in order to adjust heights of the silicone-resin layer 4 and the reflective layer 3. Therefore, the circuit board 10 according to the present disclosure has a high reflectance.

The fillers contained in the silicone-resin layer 4 are composed of a silicon dioxide, a potassium titanate, an aluminum oxide, a silicon dioxide, a barium oxide, a barium sulfate, a zinc oxide, a titanium dioxide, a barium titanate, or a zirconium oxide. The first filler among the fillers may be composed of a silicon dioxide or a potassium titanate.

An aspect ratio means a value obtained by dividing a major axis of a filler by a minor axis thereof. A major axis of a filler means the maximum length in a cross section of the filler. A minor axis of a filler means a length of a linear line perpendicular to a line segment of the major axis at the center of the line segment of the major axis. An average value of a major axis of the first filler may be equal to or more than 5 μm to equal to or less than 15 μm. An average value of a minor axis of the first filler may be equal to or more than 0.5 μm to equal to or less than 2.5 μm.

The silicone-resin layer 4 of the circuit board 10 according to the present disclosure may contain equal to or less than 80% by mass of a filler. When such a composition is satisfied, unevenness due to a filler is reduced on a surface of the silicone-resin layer 4, and thus reflectance of the circuit board 10 according to the present disclosure is improved.

The first filler in the circuit board 10 according to the present disclosure may occupy equal to or less than 40% of the total number of the fillers. When such a composition is satisfied, unevenness due to the first filler having a large aspect ratio is reduced on a surface of the silicone-resin layer 4, and thus reflectance of the circuit board 10 according to the present disclosure is improved.

In the circuit board 10 according to the present disclosure, a second filler composed of a titanium dioxide may occupy equal to or more than 40% to equal to or less than 55% of 100% by number of all of the fillers. When such a composition is satisfied, reflectance of the silicone-resin layer 4 becomes high by the second filler composed of a titanium dioxide having a high reflectance for visible light. Thus, reflectance of the circuit board 10 according to the present disclosure is improved.

An average value of a circle equivalent diameter of the second filler may be equal to or more than 0.5 µm to equal to or less than 3 µm. A circle equivalent diameter means a diameter of a circle when replaced with the circle having an area equal to a sectional area of the second filler. When such a composition is satisfied, each of the second fillers effectively reflects visible light, and thus reflectance of the circuit board 10 according to the present disclosure is improved.

In the circuit board 10 according to the present disclosure, a third filler composed of a barium titanate may occupy equal to or more than 5% to equal to or less than 10% of 100% by number of all of the fillers. When such a composition is satisfied, reflectance of the silicone-resin layer 4 becomes high by the third filler composed of a barium titanate having a high reflectance for visible light. Thus, reflectance of the circuit board 10 according to the present disclosure is improved.

An average value of a circle equivalent diameter of the third filler may be equal to or more than 0.3 µm to equal to or less than 2 µm. When such a composition is satisfied, each of the third fillers effectively reflects visible light, and thus reflectance of the circuit board 10 according to the present disclosure is improved.

Contents of the fillers in the silicone-resin layer 4 may be obtained by the following method. In the first place, the silicone-resin layer 4 is cut, and then is polished by using a Cross section polisher (CP) to obtain a polished surface. Next, by using an Energy Dispersive x-ray Spectroscopy (EDS) attached to a Scanning Electron Microscope (SEM), contents of components composing the silicone-resin layer 4 are measured. Or, the silicone-resin layer 4 is scraped off, and contents of components composing the silicone-resin layer 4 are measured by using an Inductively Coupled Plasma spectrometer (ICP) or an X-ray fluorescence spectrometer (XRF). When a total content of a silicon dioxide, a potassium titanate, an aluminum oxide, a silicon dioxide, a barium oxide, a barium sulfate, a zinc oxide, a titanium dioxide, a barium titanate, and a zirconium oxide, which compose the above-mentioned filler, is computed, the computed content is a content of the filler.

A ratio of the number of the first fillers in the silicone-resin layer 4, which have aspect ratios larger than 5, may be computed by the following method. The silicone-resin layer 4 is cut and polished by a CP, and then the polished surface is observed, as an observation surface, by using a SEM at 1500 power to take a photograph whose area is approximately 10000 µm² (for example, 100 µm×100 µm). Next, a method of a particle analysis in image analyzing software "A zo-kun" (Registered Trademark: made by Asahi Kasei Engineering Corp.; hereinafter, image analyzing software "A zo-kun" indicates image analyzing software made by Asahi Kasei Engineering Corp.) is applied to the photograph to execute an image analysis. As analysis conditions of "A zo-kun", the brightness of crystal particles is "bright", a method for binarization is "auto", and shading is "present", for example. By employing this particle analysis, a major axis and a minor axis of each of the fillers are computed. Next, a major axis is divided by a minor axis to compute an aspect ratio of each of the fillers, the number of fillers whose aspect ratio is equal to or more than 5 is counted, and the counted number is divided by the number of all of the fillers so as to compute a ratio of the number of the first filler whose aspect ratio is larger than 5. Components composing the first filler may be identified by using an EDS attached to a SEM.

When components composing each of the fillers are identified by an EDS, the number of the second fillers composed of a titanium dioxide is counted, and the counted number is divided by the number of all of the fillers, a ratio of the number of the second fillers is able to be computed. Furthermore, an average value of a circle equivalent diameter of the second filler is able to be computed by executing, similarly to the above-mentioned method, an image analysis to which a method of a particle analysis of "A zo-kun" is applied.

When components composing each of the fillers are identified by an EDS, the number of the third fillers composed of a barium titanate is counted, and the counted number is divided by the number of all of the fillers, a ratio of the number of the third fillers is able to be computed. Furthermore, an average value of a circle equivalent diameter of the third filler is able to be computed by executing, similarly to the above-mentioned method, an image analysis to which a method of a particle analysis of "A zo-kun" is applied.

In the circuit board 10 according to the present disclosure, a height of a surface of the silicone-resin layer 4 may be lower than a height of a surface of the reflective layer 3 by equal to or more than 5 µm. When such a composition is satisfied, a reflective layer 3 whose reflectance is higher than that of the silicone-resin layer 4 is able to be preferentially irradiated with light emitted from a light emitting element. Thus, reflectance of the circuit board 10 according to the present disclosure is improved.

In the circuit board 10 according to the present disclosure, an arithmetic mean roughness Ra1 obtained from a roughness curve of a surface of the silicone-resin layer 4 may be larger than an arithmetic mean roughness Ra2 obtained from a roughness curve of a surface of the reflective layer 3. When such a composition is satisfied, light emitted from a light emitting element is easily reflected from the reflective layer 3 whose reflectance is higher than that of the silicone-resin layer 4. Thus, reflectance of the circuit board 10 according to the present disclosure is improved.

An arithmetic mean roughness Ra indicates a value prescribed in JIS B 0601-2013. The arithmetic mean roughness Ra is able to be obtained by measurement in compliance with JIS B 0601-2013. As measurement conditions, for example, a measurement length may be set to 2.5 mm, a Cut-off value may be set to 0.08 mm, a stylus whose stylus-radius is 2 µm may be used, and a scanning speed may be set to 0.6 mm/s. Furthermore, it is sufficient that at least three or more points are measured in each of the surfaces of the reflective layer 3 and the silicone-resin layer 4, and a corresponding average value is obtained.

The silicone-resin layer 4 in the circuit board 10 according to the present disclosure may contain a metal particle whose circle equivalent diameter is equal to or less than 5 µm, and the number of the metal particles in an inner part of the silicone-resin layer 4 may be larger than that in a surface of the silicone-resin layer 4. When such a composition is satisfied, light of a light emitting element is able to be reflected from the metal particles while keeping the hardness of the silicone-resin layer 4. Thus, reflectance of the circuit board 10 according to the present disclosure is improved. Furthermore, when there presets no metal particle in an inner part of the silicone-resin layer 4, it is possible to keep the hardness of the silicone-resin layer 4 higher.

The metal particle is composed of selected at least one of a copper (Cu), a titanium (Ti), and a silver (Ag). The inner part of the silicone-resin layer 4 means a region closer to the substrate 1 than a part 10 μm below from a surface of the silicone-resin layer 4.

The number of metal particles within a range having 1 mm² in area on a surface of the silicone-resin layer 4 in the circuit board 10 according to the present disclosure may equal to or more than 2 to equal to or less than 5. When such a composition is satisfied, light emitted from a light emitting element is sufficiently reflected from the metal particles, and unevenness due to the metal particles is reduced on the surface of the silicone-resin layer 4. Thus, reflectance of the circuit board 10 according to the present disclosure is improved.

It is sufficient that the substrate 1 in the circuit board 10 according to the present disclosure is an insulator, and may include, for example, an aluminum-oxide-based ceramic, a zirconium-oxide-based ceramic, a composite ceramic composed of an aluminum oxide and a zirconium oxide, a silicone-nitride-based ceramic, an aluminum-nitride-based ceramic, a silicon-carbide-based ceramic, a mullite-based ceramic, or the like. When the substrate 1 is composed of an aluminum-oxide-based ceramic, processing is easy, and further mechanical strength is excellent. When the substrate 1 is composed of an aluminum-nitride-based ceramic, heat dissipation is excellent.

For example, an aluminum-oxide-based ceramic means a ceramic that contains equal to or more than 70% by mass of an aluminum oxide of 100% by mass of all of the components composing the ceramic. Material of the substrate 1 in the circuit board 10 according to the present disclosure may be identified by the following method. The substrate 1 is measured by using an X-ray diffractometer (XRD) and identification thereof is executed from a value of an obtained 2θ (where 2θ is diffraction angle) by using a JCPDS card. Next, quantitative analysis of components is executed by using an X-ray fluorescence spectrometer (XRF). When the presence of aluminum oxide is confirmed in the identification using the XRD, and a content obtained by converting a content of aluminum (Al) measured by an XRF into aluminum oxide ($Al_2O_3$) is equal to or more than 70% by mass, it is an aluminum-oxide-based ceramic.

The conductor layer 2 in the circuit board 10 according to the present disclosure may be composed of any material as long as it has conductive property. When mainly composed of a copper or a silver, the conductor layer 2 has a low electrical resistivity and a high thermal conductivity, so that it is possible to mount thereon a light emitting element that has large amount of heat generation. A main component of the conductor layer 2 means a component occupying more than 50% by mass of 100% by mass of all of the components composing the conductor layer 2.

The reflective layer 3 in the circuit board 10 according to the present disclosure may contain at least one of a gold and a silver equal to or more than 90% by mass of 100% by mass of all of the components composing the reflective layer 3. Particularly, the reflective layer 3 may contain a gold equal to or more than 95% by mass of 100% by mass of all of the components composing the reflective layer 3. As described above, when the reflective layer 3 contains a gold equal to or more than 95% by mass, a migration phenomenon of the reflective layer 3 is hard to occur when electrical current is applied to the reflective layer 3, and thus the circuit board 10 according to the present disclosure has an excellent reliability for a long time interval.

As an identification method of components composing the conductor layer 2 and the reflective layer 3, for example, the circuit board 10 is cut to obtain a cross section illustrated in FIG. 1, the cross section, which is obtained by polishing by using a CP, is observed as an observation surface by using a SEM, and the identification is executed by using an EDS attached to the SEM. Or, each of the conductor layer 2 and the reflective layer 3 may be scraped off, and may be measured by using an ICP and/or an XRF to execute the identification.

The substrate 1 of the circuit board 10 according to the present disclosure may include a through hole. When an electrode made of an electrically conducting material is provided in the through hole of the substrate 1, it is possible to connect it with an external power source and the like and further to supply electricity to it. When a thermal via made of a high-thermal conductivity material is provided in the through hole of the substrate 1, it is possible to improve heat dissipation of the substrate 1.

As illustrated in FIG. 1, a light emitting device 20 according to the present disclosure includes the circuit board 10 having the above-mentioned configuration and a light emitting element 5 arranged on the circuit board 10. In FIG. 1, a case is exemplified in which the light emitting element 5 is arranged on a reflective layer 3a, and the light emitting element 5 is electrically connected with a reflective layer 3b by a bonding wire 6. However not illustrated, in order to protect the light emitting element 5, a surface on which the light emitting element 5 is mounted, in addition to the light emitting element 5 of the light emitting device 20, may be covered with a sealing material and the like. The sealing material may contain a fluorescent material for wavelength conversion and the like.

Hereinafter, one example of a manufacturing method of the circuit board according to the present disclosure will be explained.

First, for example, an aluminum-nitride-based ceramic or an aluminum-oxide-based ceramic is prepared as a substrate by a well-known forming method and a well-known firing method. In fabrication of an aluminum-oxide-based ceramic, it may contain at least one of a barium oxide (BaO) and a zirconium oxide ($ZrO_2$) in order to improve reflectance of the substrate.

In a case where a through hole is formed in a substrate, the through hole may be formed along with an external shape in forming the molded body, the through hole may be formed by using punching, blast, or laser on a molded body only whose external shape has been processed, or the through hole may be formed by using blast or laser on a sintered body. The thickness of the substrate is equal to or more than 0.15 mm to equal to or less than 1.5 mm, for example.

Next, thin layers of a titanium and a cupper are formed on the substrate by sputtering. In the thin films, an average film thickness of the titanium thin layer is equal to or more than 0.03 μm to equal to or less than 0.2 μm, and an average film thickness of the cupper thin layer is equal to or more than 0.5 μm to equal to or less than 2 μm, for example.

Next, a resist pattern is formed on the thin film by using photolithography and then a thick layer is newly formed by using copper electroplating to obtain a conductor layer. An average film thickness of the cupper layer formed by using copper electroplating is equal to or more than 40 μm to equal to or less than 100 μm, for example. Moreover, buffing or chemical polishing may be performed on a surface of the conductor layer.

Next, nickel-silver electroplating or electroless silver plating is executed to obtain a silver reflective layer on the conductor layer. Or, electroless nickel plating is executed, and then electroless gold plating is executed to obtain a gold reflective layer on the conductor layer. Or, electroless nickel plating, electroless palladium plating, and electroless gold plating are executed in this order to obtain a gold reflective layer on the conductor layer. An average film thickness of the nickel layer is equal to or more than 1 μm to equal to or less than 10 μm, for example. An average film thickness of the palladium layer is equal to or more than 0.05 μm to equal to or less than 0.5 μm, for example. An average film thickness of the reflective layer is equal to or more than 0.1 μm to equal to or less than 10 μm, for example. When the average film thickness of the reflective layer is equal to or more than 0.2 μm, a peculiarly high reflectance is obtained.

Next, the resist pattern is removed, and extended portions of the thin layers of a titanium and a cupper are removed by etching.

Next, paste (Hereinafter, may be referred to as "paste for resin layer") to be a silicone-resin layer is prepared. The paste for resin layer is obtained by dispersing a silicone-resin raw material and a filler powder in an organic solvent. A mixing ratio between the silicone-resin raw material and the filler powder is equal to or more than 45% by mass of a filler powder among total 100 parts by mass of a silicone-resin raw material and a filler powder. Moreover, the filler powder may be equal to or less than 80% by mass among total 100 parts by mass of the silicone-resin raw material and the filler powder.

As the silicone-resin raw material, a organopolysiloxane, an organohydrogenpolysiloxane, a platinum-containing polysiloxane, or the like may be used.

As filler powder, a silicon dioxide, a potassium titanate, an aluminum oxide, a silicon dioxide, a barium oxide, a barium sulfate, a zinc oxide, a titanium dioxide, a barium titanate, or a zirconium oxide may be used.

The filler powder is prepared in such a manner that the first filler whose aspect ratio is larger than 5 occupies equal to or more than 5% of 100% of the total number of the fillers. Moreover, the filler powder may be prepared in such a manner that the first filler, whose aspect ratio is larger than 5, occupies equal to or less than 40%. The first filler, whose aspect ratio is larger than 5, may be composed of a silicon dioxide and/or a potassium titanate.

The filler powder may be prepared in such a manner that the second filler made of a titanium dioxide occupies equal to or more than 40% to equal to or less than 55% of 100% of the total number of the fillers. As the second filler, a filer may be used, whose average value of a circle equivalent diameter is equal to or more than 0.5 μm to equal to or less than 3 μm.

The filler powder may be prepared in such a manner that the third filler made of a barium titanate occupies equal to or more than 5% to equal to or less than 10% of 100% of the total number of the fillers. As the third filler, a filer may be used, whose average value of a circle equivalent diameter is equal to or more than 0.3 μm to equal to or less than 2 μm.

As the organic solvent, selected one or more of a carbitol, a carbitol acetate, a terpineol, a metacresol, a dimethylimidazole, a dimethyl imidazolidinone, a dimethylformamide, a diacetone alcohol, a triethylene glycol, a p-xylene, an ethyl lactate, and an isophorone may be mixed to be used.

The organic solvent may be prepared in such a manner that a mass ratio thereof is 20 to 100 when a mass ratio of the silicone-resin raw material is 1.

In order to make a silicone-resin layer contain a metal particle, a metal particle whose circle equivalent diameter is equal to or less than 5 μm, which is composed of selected at least one of a cupper, a titanium, and a silver, may be added to a paste for resin layer.

The paste for resin layer is printed on the substrate so that it is in contact with the conductor layer and the reflective layer. A thickness of the paste for resin layer is set to similar to a thickness obtained by summing thicknesses of the conductor layer and the reflective layer. In order to make the number of metal particles in a surface side of the silicone-resin layer larger than that in an inner part of the silicone-resin layer, it is sufficient that two types of pastes for resin layer having different numbers of added metal particles are prepared, a paste for resin layer whose number of metal particles is smaller is printed in first, and a paste for resin layer whose number of metal particles is larger is printed thereon.

Next, a thermal treatment is executed at a maximum temperature of equal to or more than 140° C. to equal to or less than 200° C. for equal to or more than 0.5 hours to equal to or less than 3 hours.

Next, buffing that is a polishing treatment is executed on surfaces of the reflective layer and the silicone-resin layer. As conditions of the buffing, it is sufficient that a sharpening stone is used, which is made of a silicon carbide, a white alumina, or a diamond and has grit equal to or more than #400 to equal to or less than #3000, and a feed speed is equal to or more than 500 mm/s to equal to or less than 2000 mm/s. When the buffing is adjusted within the above-mentioned conditions, it is possible to make the surfaces of the reflective layer and the silicone-resin layer an arbitrary surface profile. When the buffing is executed more intensively on a surface of the silicone-resin layer than a surface of the reflective layer, it is possible to make a height of the surface of the silicone-resin layer lower than a height of the surface of the reflective layer by equal to or more than 5 μm. Thus, a circuit board according to the present disclosure is obtained. Note that, it may be divided into pieces by dicing, if necessary.

Next, a light emitting device according to the present disclosure is obtained by mounting a light emitting element on a reflective layer of the circuit board according to the present disclosure, for example.

Hereinafter, although a practical example(s) according to the present disclosure will be explained specifically, the present disclosure is not limited to such a practical example(s).

Practical Example 1

Samples were fabricated in which, in a silicone-resin layer, filler contents and number ratios of the first filler whose aspect ratio was larger than 5 were different from one another to execute measurement of their reflectance.

A substrate was prepared which was made of an aluminum-nitride-based ceramic and whose size was 0.38 mm×200 mm×200 mm (thickness×length×width).

Next, a titanium thin layer and a cupper thin layer were formed on the substrate by sputtering. They were fabricated in such a manner that an average film thickness of the titanium thin layer was 0.1 μm, and an average film thickness of the cupper thin layer was 1.0 μm.

Next, a resist pattern was formed on the thin film by photolithography, and a cupper thick layer was formed, by using copper electroplating, whose average film thickness was 60 μm to obtain a conductor layer.

Next, electrolytic nickel-silver plating was executed to obtain a reflective layer made of a silver on the conductor layer. They were fabricated in such a manner that an average film thickness of a nickel layer between the conductor layer and the reflective layer was 5 µm, and an average film thickness of the reflective layer was 3 µm.

Next, the resist pattern was removed, and extended portions of the thin layers of a titanium and a cupper were removed by etching to obtain a circuit pattern constituted of a laminated body of the conductor layer and the reflective layer.

Next, a material obtained by dispersing a silicone-resin raw material and a filler powder in an organic solvent was prepared as a paste for resin layer. Note that a mixing ratio of a silicone-resin raw material and a filler powder was adjusted so that a content of a filler in a silicone-resin layer became a value illustrated in Table 1.

As a silicone-resin raw material, a polyorganosiloxane was used. A filler powder was prepared in such a manner that, among 100% of the number of all of the fillers, the first filler, made of a silicon dioxide, whose aspect ratio was larger than 5 was a value illustrated in Table 1, the second filler, made of a titanium dioxide, whose aspect ratio was equal to or less than 5 was 38%, and the rest was a filler, made of a silicon dioxide, whose aspect ratio was equal to or less than 5. The second filler was used whose average value of a circle equivalent diameter was 3.7 µm.

A carbitol was used as an organic solvent, and was prepared in such a manner that a mass ratio of an organic solvent to a silicone-resin raw material was 60 to 1.

Next, a paste for resin layer was printed on a substrate in such a manner that it was in contact with a conductor layer and a reflective layer and covered whole of the substrate. Next, a maximum temperature of 150° C. was retained for 1 hour to execute a thermal treatment.

Next, buffing was executed on surfaces of a reflective layer and a silicone-resin layer, and then dicing was executed to obtain samples each piece of which had a size of 9 mm×9 mm (depth×width).

Next, a measurement was executed on each of the samples by using a spectrophotometric colorimeter (made by Minolta Co., Ltd., CM-3700A) under conditions of Standard Illuminant D65, wavelength range 360 to 740 nm, viewing angle 10°, and measurement/illumination area 3×5 mm, and reflectance of 500 nm was measured from the measurement result.

Results are illustrated in Table 1.

TABLE 1

| Sample No. | Filler Content (% by mass) | Number Ratio of First Filler (%) | Reflectance (%) |
|---|---|---|---|
| 1 | 40 | 10 | 90.0 |
| 2 | 43 | 3 | 90.8 |
| 3 | 45 | 5 | 93.0 |
| 4 | 59 | 8 | 94.3 |
| 5 | 72 | 23 | 95.1 |
| 6 | 80 | 40 | 93.8 |
| 7 | 80 | 42 | 92.4 |
| 8 | 85 | 40 | 91.3 |

As illustrated in Table 1, reflectance of samples No. 3 to 8 was equal to or more than 91.3% and was higher than that of samples No. 1 and 2. From these results, it was found that a circuit board had a high reflectance when its silicone-resin layer contains equal to or more than 45% by mass of the plurality of fillers and the first filler, whose aspect ratio was larger than 5, occupied equal to or more than 5% of 100% of the total number of the fillers.

Among samples No. 3 to 8, reflectance of samples No. 3 to 7 was equal to or more than 92.4%, namely high. From these results, it was found that a circuit board had a higher reflectance when a filler content of its silicone-resin layer was equal to or less than 80% by mass.

Among samples No. 3 to 7, reflectance of samples No. 3 to 6 was equal to or more than 93.0%, namely high. From these results, it was found that a circuit board had a further higher reflectance when the first filler occupied equal to or less than 40% of the number of all of the fillers.

Practical Example 2

Next, samples were fabricated whose number ratios of the second filler in a silicone-resin layer were different from one another to execute measurement of their reflectance.

A fabricating method for samples was similar to the fabrication method for sample No. 4 according to Practical Example 1 except that filler powders were prepared in such a manner that the second filler made of a titanium dioxide occupied a value illustrated in Table 2 of 100% of the total number of the fillers. Note that sample No. 9 was the same as sample No. 4 according to Practical Example 1.

Reflectance of each of the obtained samples was evaluated in the same method as that of Practical Example 1.

Results are illustrated in Table 2.

TABLE 2

| Sample No. | Number Ratio of Second Filler (%) | Reflectance (%) |
|---|---|---|
| 9 | 38 | 94.3 |
| 10 | 40 | 95.1 |
| 11 | 47 | 95.5 |
| 12 | 55 | 95.0 |
| 13 | 58 | 94.4 |

As illustrated in Table 2, reflectance of samples No. 10 to 12 was equal to or more than 95.0% and was higher than that of samples No. 9 and 13. From these results, it was found that a circuit board had a higher reflectance when the second filler made of a titanium dioxide occupied equal to or more than 40% to equal to or less than 55% of 100% of the total number of the fillers.

Practical Example 3

Next, samples were fabricated whose average values of a circle equivalent diameter of the second filler in a silicone-resin layer were different from one another to execute measurement of their reflectance.

A fabricating method for samples was similar to the fabrication method for sample No. 11 according to Practical Example 2 except that the second fillers were used whose average values of a circle equivalent diameter were illustrated in Table 3. Note that sample No. 18 was the same as sample No. 11 according to Practical Example 2.

Reflectance of each of the obtained samples was evaluated in the same method as that of Practical Example 1.

Results are illustrated in Table 3.

TABLE 3

| Sample No. | Average Value of Circle Equivalent Diameter of Second Filler (µm) | Reflectance (%) |
|---|---|---|
| 14 | 0.3 | 96.6 |
| 15 | 0.5 | 96.6 |
| 16 | 1.6 | 96.3 |

TABLE 3-continued

| Sample No. | Average Value of Circle Equivalent Diameter of Second Filler (µm) | Reflectance (%) |
|---|---|---|
| 17 | 3.0 | 96.1 |
| 18 | 3.7 | 95.5 |

As illustrated in Table 3, reflectance of samples No. 14 to 17 was equal to or more than 96.1%, and was higher than that of sample No. 18. Sample No. 14 and sample No. 15 had the same reflectance. From these results, it was found that a circuit board had a further higher reflectance when an average value of a circle equivalent diameter of the second filler was equal to or more than 0.5 µm to equal to or less than 3 µm.

Practical Example 4

Next, samples were fabricated whose number ratios of the third filler in a silicone-resin layer were different from one another to execute measurement of their reflectance.

A fabricating method for samples was similar to the fabrication method for sample No. 17 according to Practical Example 3 except that a filler was prepared in such a manner that, among 100% of the number of all of the fillers, the first filler occupied 8%, the second filler occupied 47%, an aspect ratio was equal to or less than 5, the third filler made of a barium titanate occupied a value illustrated in Table 4, and the rest was made of a silicon dioxide. Note that a filler whose average value of a circle equivalent diameter was 2.6 µm was used as the third filler. Note that sample No. 19 was the same as sample No. 17 according to Practical Example 3.

Reflectance of each of the obtained samples was evaluated in the same method as that of Practical Example 1.

Results are illustrated in Table 4.

TABLE 4

| Sample No. | Number of Ratio Third Filler (%) | Reflectance (%) |
|---|---|---|
| 19 | 0 | 96.1 |
| 20 | 2 | 96.2 |
| 21 | 5 | 96.8 |
| 22 | 7.5 | 97.1 |
| 23 | 10 | 97.3 |
| 24 | 15 | 97.3 |

As illustrated in Table 4, reflectance of samples No. 21 to 24 was equal to or more than 96.8%, and was higher than that of samples No. 19 to 20. Reflectance of sample No. 23 was the same as that of sample No. 24. From these results, it was found that a circuit board had a further higher reflectance when the third filler made of a barium titanate occupies equal to or more than 5% to equal to or less than 10% of 100% of the total number of the fillers.

Practical Example 5

Next, samples were fabricated whose average value of a circle equivalent diameter of the third filler in a silicone-resin layer was different from one another to execute measurement of their reflectance.

A fabricating method for samples was similar to the fabrication method for sample No. 21 according to Practical Example 4 except that the third filler was used whose average value of a circle equivalent diameter was illustrated in Table 5. Note that sample No. 25 was the same as sample No. 21 according to Practical Example 4.

Reflectance of each of the obtained samples was evaluated in the same method as that of Practical Example 1.

Results are illustrated in Table 5.

TABLE 5

| Sample No. | Average Value of Circle Equivalent Diameter Of Third Filler (µm) | Reflectance (%) |
|---|---|---|
| 25 | 2.6 | 96.8 |
| 26 | 2.0 | 97.3 |
| 27 | 0.5 | 97.6 |
| 28 | 0.3 | 97.4 |
| 29 | 0.1 | 96.7 |

As illustrated in Table 5, reflectance of samples No. 26 to 28 was equal to or more than 97.3%, and was higher than that of samples No. 25 and 29. From there results, it was found that a circuit board had a further higher reflectance when an average value of a circle equivalent diameter of the third filler was equal to or more than 0.3 µm to equal to or less than 2 µm.

Practical Example 6

Next, samples were fabricated whose height relation between surfaces of a silicone-resin layer and a reflective layer was different from one another to execute measurement of their reflectance.

A fabricating method for samples was similar to the fabrication method for sample No. 11 according to Practical Example 2 except that buffing was executed in such a manner that a value obtained by subtracting a height of a surface of a silicone-resin layer from that of a reflective layer was a value illustrated in Table 6. Note that sample No. 30 is the same as sample No. 11 according to Practical Example 2.

Reflectance of each of the obtained samples was evaluated in the same method as that of Practical Example 1.

Results are illustrated in Table 6.

TABLE 6

| Sample No. | Difference between Surface Heights (µm) | Reflectance (%) |
|---|---|---|
| 30 | 0 | 95.5 |
| 31 | 3 | 95.5 |
| 32 | 5 | 96.1 |
| 33 | 10 | 96.2 |

As illustrated in Table 6, reflectance of samples No. 32 and 33 was equal to or more than 96.1%, and was higher than that of samples No. 30 and 31. From these results, it was found that a circuit board had a further higher reflectance when a height of a surface of a silicone-resin layer is lower than that of a reflective layer by equal to or more than 5 µm.

Practical Example 7

Next, samples were fabricated whose arithmetic mean roughness Ra of surfaces of a silicone-resin layer and a reflective layer was different from one another to execute measurement of their reflectance.

A fabricating method for samples was similar to the fabrication method for sample No. 33 according to Practical Example 6 except that buffing was executed in such a manner that values of the arithmetic mean roughness Ra1 of a surface of a silicone-resin layer and the arithmetic mean roughness Ra2 of a surface of a reflective layer were those illustrated in Table 7. Note that sample No. 34 is the same as sample No. 33 according to Practical Example 6.

Reflectance of each of the obtained samples was evaluated in the same method as that of Practical Example 1.

Results are illustrated in Table 7.

TABLE 7

| Sample No. | Surface Roughness Ra1 (μm) | Surface Roughness Ra2 (μm) | Reflectance (%) |
|---|---|---|---|
| 34 | 0.2 | 0.2 | 96.2 |
| 35 | 0.2 | 0.1 | 96.5 |

As illustrated in Table 7, reflectance of sample No. 35 was 96.5%, and was higher than that of sample No. 34. From these results, it was found that a circuit board had a further higher reflectance when the arithmetic mean roughness Ra1 of a surface of a silicone-resin layer is larger than the arithmetic mean roughness Ra2 of a surface of a reflective layer.

Practical Example 8

Next, samples were fabricated whose number of metal particles having circle equivalent diameter equal to or less than 5 μm in a silicone-resin layer to execute measurement of their reflectance.

A fabricating method for samples was similar to the fabrication method for sample No. 35 according to Practical Example 7 except that two types of pastes for resin layer, which were obtained by differing an addition amount of a metal particle made of a cupper whose circle equivalent diameter is equal to or less than 5 μm, were prepared and the paste for resin layer was printed in such a manner that the number of the metal particles within a range having 1 mm$^2$ in area was a value illustrated in Table 8. Note that sample No. 36 is the same as sample No. 35 according to Practical Example 7.

Reflectance of each of the obtained samples was evaluated in the same method as that of Practical Example 1.

Results are illustrated in Table 8.

TABLE 8

| Sample No. | Number of Metal Particles (Number) Surface | Number of Metal Particles (Number) Inner Part | Reflectance (%) |
|---|---|---|---|
| 36 | 0 | 0 | 96.5 |
| 37 | 0 | 1 | 96.5 |
| 38 | 1 | 0 | 97.1 |
| 39 | 2 | 0 | 97.4 |
| 40 | 5 | 0 | 97.3 |
| 41 | 6 | 0 | 97.0 |

As illustrated in Table 8, reflectance of samples No. 38 to 41 was equal to or more than 97.0%, and was higher than that of samples No. 36 and 37. From these results, it was found that a circuit board had a further higher reflectance when the number of the metal particles in a surface of the silicone-resin layer is larger than that in an inner part of the silicone-resin layer.

Reflectance of samples No. 39 and 40 was equal to or more than 97.3%, and was higher among samples No. 38 to 41. From these results, it was found that a circuit board had a further higher reflectance when the number of the metal particles within a range having 1 mm$^2$ in surface area was equal to or more than 2 to equal to or less than 5.

The invention claimed is:

1. A circuit board comprising:
    a substrate;
    a conductor layer arranged on the substrate;
    a reflective layer arranged on the conductor layer; and
    a silicone-resin layer arranged on the substrate, the silicone-resin layer contacting the conductor layer and the reflective layer, wherein
    the silicone-resin layer contains greater than or equal to 45% by mass of a plurality of fillers, and a first filler, whose aspect ratio is larger than 5, occupies greater than or equal to 5% of a total number of particles included in the plurality of fillers.

2. The circuit board according to claim 1, wherein
    the first filler is made of a silicon dioxide or a potassium titanate.

3. The circuit board according to claim 1, wherein
    the silicone-resin layer contains less than or equal to 80% by mass of the plurality of fillers.

4. The circuit board according to claim 1, wherein
    the first filler is less than or equal to 40% of the total number of the particles included in the plurality of fillers.

5. The circuit board according to claim 1, wherein
    a second filler made of a titanium dioxide occupies greater than or equal to 40% to less than or equal to 55% of the particles included in the total number of the plurality of fillers.

6. The circuit board according to claim 5, wherein
    an average value of a circle equivalent diameter of the second filler is greater than or equal to 0.5 μm to less than or equal to 3 μm.

7. The circuit board according to claim 1, wherein
    a third filler made of a barium titanate occupies greater than or equal to 5% to less than or equal to 10% of the particles included in the total number of the plurality of fillers.

8. The circuit board according to claim 7, wherein
    an average value of a circle equivalent diameter of the third filler is greater than or equal to 0.3 μm to less than or equal to 2 μm.

9. The circuit board according to claim 1, wherein
    a height of a surface of the silicone-resin layer is lower than a height of a surface of the reflective layer by greater than or equal to 5 μm.

10. The circuit board according to claim 1, wherein
    an arithmetic mean roughness Ra1 obtained from a roughness curve of a surface of the silicone-resin layer is larger than an arithmetic mean roughness Ra2 obtained from a roughness curve of a surface of the reflective layer.

11. The circuit board according to claim 1, wherein
    the silicone-resin layer contains metal particles whose circle equivalent diameter is less than or equal to 5 μm, and
    a number of the metal particles in a surface of the silicone-resin layer is larger than that in an inner part of the silicone-resin layer.

12. The circuit board according to claim 11, wherein a number of the metal particles within a range having 1 mm$^2$ in area on the surface is greater than or equal to 2 to less than or equal to 5.

13. A light emitting device comprising:
the circuit board according to claim 1; and
a light emitting element arranged on the circuit board.

* * * * *